(12) United States Patent
Ringsrud et al.

(10) Patent No.: US 10,119,998 B2
(45) Date of Patent: Nov. 6, 2018

(54) VARIABLE CAPACITANCE NON-CONTACT AC VOLTAGE MEASUREMENT SYSTEM

(71) Applicant: Fluke Corporation, Everett, WA (US)

(72) Inventors: Paul Andrew Ringsrud, Langley, WA (US); Clark N. Huber, Everett, WA (US); Michael F. Gallavan, Edmonds, WA (US)

(73) Assignee: Fluke Corporation, Everett, WA (US)

( * ) Notice: Subject to any disclaimer, the term of this patent is extended or adjusted under 35 U.S.C. 154(b) by 85 days.

(21) Appl. No.: 15/345,256

(22) Filed: Nov. 7, 2016

(65) Prior Publication Data

US 2018/0128858 A1 May 10, 2018

(51) Int. Cl.
*G01R 1/20* (2006.01)
*G01R 15/16* (2006.01)
(Continued)

(52) U.S. Cl.
CPC ............ *G01R 15/16* (2013.01); *G01R 1/22* (2013.01); *G01R 15/14* (2013.01); *G01R 15/142* (2013.01); *G01R 19/00* (2013.01); *G01R 19/2503* (2013.01)

(58) Field of Classification Search
CPC .... G01R 21/06; G01R 31/11; G01R 31/1227; G01R 11/04; G01R 15/00; G01R 15/04;
(Continued)

(56) References Cited

U.S. PATENT DOCUMENTS 5,473,244 A 12/1995 Libove et al.
5,583,444 A 12/1996 Nakamura et al.
(Continued)

FOREIGN PATENT DOCUMENTS

EP 1 249 706 B1 9/2007
JP 9-184866 A 7/1997
(Continued)

OTHER PUBLICATIONS

Hioki, "3258 : Safety HiTESTER," Revised Edition 5, Hioki E. E. Corporation, Nagano Japan, 2 pages.
(Continued)

*Primary Examiner* — Vinh Nguyen
(74) *Attorney, Agent, or Firm* — Seed Intellectual Property Law Group LLP (57) ABSTRACT

Systems and methods for measuring alternating current (AC) voltage of an insulated conductor (e.g., insulated wire) are provided, without requiring a galvanic connection between the conductor and a test electrode or probe. A non-galvanic contact (or "non-contact") voltage measurement system includes a variable capacitance subsystem which operates to generate a variable capacitive voltage between an insulated conductor under test and earth ground. During measurement, the non-contact voltage measurement system varies the capacitance of the variable capacitance subsystem to change the impedance of a capacitive divider circuit between the insulated conductor under test and earth ground. By sequentially making two (or three) measurements across the variable capacitance subsystem, the AC voltage of the insulated conductor can be determined without requiring any galvanic connection to the insulated conductor. The determined AC voltage of the insulated conductor may then be presented to an operator and/or communicated to an external device.

26 Claims, 6 Drawing Sheets

(51) Int. Cl.
*G01R 19/25* (2006.01)
*G01R 1/22* (2006.01)
*G01R 15/14* (2006.01)
*G01R 19/00* (2006.01)

(58) Field of Classification Search
CPC ............... G01R 15/142; G01R 15/144; G01R 19/0092; G01R 19/175; G01R 19/2513; G01R 1/18; G01R 1/36; G01R 21/00; G01R 27/2611; G01R 29/12; G01R 31/005; G01R 31/006; G01R 31/04; G01R 31/07; G01R 31/327; G01R 31/346; G01R 35/00; G01R 15/181; G01R 19/00; G01R 27/06; G01R 27/26; G01R 1/22; G01R 15/14; G01R 15/16; G01R 15/207; G01R 15/125; G01R 15/146; G01R 15/148; G01R 19/25; G01R 19/2503; G01R 19/2516; G01R 1/07; G01R 27/2605; G01R 31/022; G01R 31/12; G01R 31/1263; G01R 31/129; G01R 31/14; G01R 31/2812; G01R 31/312; G01R 35/005; G06F 3/044; G06F 3/0416; G01N 27/227; G01N 2030/645; G01N 27/228; G01N 30/64; G01N 30/95; H01R 13/5845; H01R 13/6683

See application file for complete search history.

(56) References Cited

U.S. PATENT DOCUMENTS

| | | | |
|---|---|---|---|
| 5,973,501 A | 10/1999 | Reichard | |
| 6,014,027 A | 1/2000 | Reichard | |
| 6,043,640 A | 3/2000 | Lauby et al. | |
| 6,118,270 A | 9/2000 | Singer et al. | |
| 6,177,800 B1 | 1/2001 | Kubby et al. | |
| 6,664,708 B2 | 12/2003 | Schlimak et al. | |
| 6,812,685 B2 | 11/2004 | Steber et al. | |
| 6,825,649 B2 | 11/2004 | Nakano | |
| 7,084,643 B2 | 8/2006 | Howard et al. | |
| 7,466,145 B2 | 12/2008 | Yanagisawa | |
| 8,054,061 B2 | 11/2011 | Prance et al. | |
| 8,222,886 B2 * | 7/2012 | Yanagisawa | G01R 15/16 324/123 R |
| 8,680,845 B2 | 3/2014 | Carpenter et al. | |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 9,915,689 B2 * | 3/2018 | Matsuura | G01R 15/00 |
| 2002/0167303 A1 | 11/2002 | Nakano | |
| 2007/0086130 A1 | 4/2007 | Sorensen | |
| 2010/0090682 A1 | 4/2010 | Armstrong | |
| 2010/0283539 A1 | 11/2010 | Yanagisawa | |
| 2012/0200291 A1 | 8/2012 | Carpenter et al. | |
| 2012/0259565 A1 | 10/2012 | Oshima et al. | |
| 2012/0274141 A1 * | 11/2012 | Shibahara | H01G 5/18 307/75 |
| 2013/0076343 A1 | 3/2013 | Carpenter et al. | |
| 2014/0035607 A1 | 2/2014 | Heydron et al. | |
| 2014/0062459 A1 | 3/2014 | El-Essawy et al. | |
| 2016/0109486 A1 | 4/2016 | Yanagisawa | |
| 2017/0082664 A1 * | 3/2017 | Yamada | G01R 15/16 |

FOREIGN PATENT DOCUMENTS

| | | |
|---|---|---|
| JP | 2000-147035 A | 5/2000 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2014-106220 A | 6/2014 |
| JP | 2016-3997 A | 1/2016 |

OTHER PUBLICATIONS

Mitchell Instrument Company Inc., clipping from the Mitchell Catalogue, undated, 1 page.
Takahashi, "Clamp on Power Logger PW3365 : Safety Voltage Sensor PW9020," *HIOKI Technical Notes* 1(1): 2015, 8 pages.
Tsang et al., "Dual capacitive sensors for non-contact AC voltage measurement," *Sensors and Actuators A* 167:261-266, 2011.

* cited by examiner

VARIABLE CAPACITANCE NON-CONTACT AC VOLTAGE MEASUREMENT SYSTEM

BACKGROUND

Technical Field

The present disclosure generally relates to measurement of electrical characteristics, and more particularly, to non-contact measurement of alternating current (AC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least one measurement electrode or probe into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

A non-contact voltage detector is commonly used to detect the presence of alternating current (AC) voltage, typically high voltage, without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A system to measure alternating current (AC) voltage in an insulated conductor may be summarized as including: a conductive sensor positionable adjacent the insulated conductor without galvanically contacting the conductor, wherein the conductive sensor capacitively couples with the insulated conductor; a variable capacitance subsystem which includes a first capacitance subsystem node and a second capacitance subsystem node, the first capacitance subsystem node electrically coupled to the conductive sensor, and the first capacitance subsystem node and the second capacitance subsystem node having a capacitance therebetween which is selectively variable between at least a first capacitance value ($C_1$) and a second capacitance value ($C_2$), the second capacitance value ($C_2$) being different from the first capacitance value ($C_1$); a voltage measurement subsystem which in operation detects a voltage between the first capacitance subsystem node and the second capacitance subsystem node; at least one nontransitory processor-readable storage medium that stores at least one of processor-executable instructions or data; and at least one processor communicatively coupled to the at least one nontransitory processor-readable storage medium, and in operation, in response to execution of the processor-executable instructions or data, the at least one processor: causes the variable capacitance subsystem to have the first capacitance value ($C_1$) between the first capacitance subsystem node and the second capacitance subsystem node; causes the voltage measurement subsystem to detect a first voltage ($V_{M1}$) between the first capacitance subsystem node and the second capacitance subsystem node; causes the variable capacitance subsystem to have the second capacitance value ($C_2$) between the first capacitance subsystem node and the second capacitance subsystem node; causes the voltage measurement subsystem to detect a second voltage ($V_{M2}$) between the first capacitance subsystem node and the second capacitance subsystem node; and determines the AC voltage ($V_{AC}$) in the insulated conductor based at least in part on the detected first voltage ($V_{M1}$) and the detected second voltage ($V_{M2}$).

The at least one processor may: determine the AC voltage ($V_{AC}$) in the insulated conductor according to the formula: $V_{AC} = V_{M1} \times [(C_1/C_2)]/[(C_1 V_{M1}/C_2 V_{M2}) - 1]$. The voltage measurement subsystem may include at least one analog-to-digital converter (ADC). The voltage measurement subsystem may have an effective resolution of at least 20 bits. The variable capacitance subsystem may include at least a first capacitor and a second capacitor which are each selectively electrically coupled between the first capacitance subsystem node and the second capacitance subsystem node. The variable capacitance subsystem may include a first capacitor electrically coupled between the first capacitance subsystem node and the second capacitance subsystem node, and a second capacitor which is selectively electrically coupled between the first capacitance subsystem node and the second capacitance subsystem node. The first capacitance value ($C_1$) and the second capacitance value ($C_2$) may satisfy a ratio ($C_1:C_2$) of the first capacitance value ($C_1$) to the second capacitance value ($C_2$) that is between 2:5 and 1:10 inclusive. The first capacitance value (C1) may be selectively variable to accommodate different values of input signals and input capacitance. One of the first capacitance value ($C_1$) and the second capacitance value ($C_2$) may be at least twice the other of the first capacitance value ($C_1$) and the second capacitance value ($C_2$). Each of the first capacitance value ($C_1$) and the second capacitance value ($C_2$) may be between 1000 picofarads (pF) and 5000 pF. The system may further include: a user interface communicatively coupled to the at least one processor, wherein the at least one processor presents the determined AC voltage ($V_{AC}$) via the user interface. The user interface may include at least one of a display or a plurality of light emitters. In operation, the second capacitance subsystem node may be electrically coupled to a reference node via the body of a user operating the system. The system may further include: a reference connection which electrically couples the second capacitance subsystem node to earth ground. The first capacitance subsystem node and the second capacitance subsystem node may have a capacitance therebetween which is further selectively variable between at least the first capacitance value ($C_1$), the second capacitance value ($C_2$) and a third capacitance value ($C_3$), and in response to execution of the processor-executable instructions or data in the nontransitory processor-readable storage medium, the at least one processor may: cause the variable capacitance subsystem to have the third capacitance value ($C_3$) between the first capacitance subsystem node and the second capacitance subsystem node; cause the voltage measurement subsystem to detect a third voltage ($V_{M3}$) between the first capacitance subsystem node and the second capacitance subsystem node; and determine the AC voltage ($V_{AC}$) in the insulated conductor based at least in part on the detected first voltage ($V_{M1}$), second voltage ($V_{M2}$), and third voltage ($V_{M3}$). The at least one processor may: determine the AC voltage ($V_{AC}$) in the insulated conductor according to the formula: $V_{AC}=C_3 V_{M3} \times [(V_{M2}-V_{M1})/(C_1 V_{M1}-C_2 V_{M2})]+V_{M3}$.

A system to measure alternating current (AC) voltage in an insulated conductor may be summarized as including: a conductive sensor positionable adjacent an insulated conductor without galvanically contacting the conductor, wherein the conductive sensor capacitively couples with the insulated conductor; a variable capacitance subsystem electrically coupled to the conductive sensor; a voltage measurement subsystem which in operation detects a voltage across the variable capacitance subsystem; at least one nontransitory processor-readable storage medium that stores at least one of processor-executable instructions or data; and at least one processor communicatively coupled to the at least one nontransitory processor-readable storage medium, and in operation, in response to execution of the processor-executable instructions or data, the at least one processor: causes the variable capacitance subsystem to have a first capacitance value ($C_1$); detects, via the voltage measurement subsystem, a first voltage ($V_{M1}$) across the variable capacitance subsystem when the conductive sensor is positioned adjacent the insulated conductor; causes the variable capacitance subsystem to have a second capacitance value ($C_2$); detects, via the voltage measurement subsystem, a second voltage ($V_{M2}$) across the variable capacitance subsystem when the conductive sensor is positioned adjacent the insulated conductor; and determines the AC voltage ($V_{AC}$) in the insulated conductor based at least in part on the detected first voltage ($V_{M1}$) and the detected second voltage ($V_{M2}$).

The at least one processor may: determine the AC voltage ($V_{AC}$) in the insulated conductor according to the formula: $V_{AC}=V_{M1} \times [(C_1/C_2)-1]/[(C_1 V_{M1}/C_2 V_{M2})-1]$. The voltage measurement subsystem may include at least one analog-to-digital converter (ADC) which has an effective resolution of at least 20 bits. The variable capacitance subsystem may include at least a first capacitor, a second capacitor, and a switch coupled to at least one of the first capacitor and the second capacitor, wherein the switch is selectively operable by the at least one processor to cause the variable capacitance subsystem to have the first capacitance value ($C_1$) and the second capacitance value ($C_2$).

A method of operating a system to measure alternating current (AC) voltage in an insulated conductor may be summarized as including a conductive sensor positionable adjacent an insulated conductor without galvanically contacting the conductor, and a variable capacitance subsystem electrically coupled to the conductive sensor; the method comprising: causing, by at least one processor, the variable capacitance subsystem to have a first capacitance value ($C_1$); detecting, by at least one processor, a first voltage ($V_{M1}$) across the variable capacitance subsystem when the conductive sensor is positioned adjacent the insulated conductor; causing, by at least one processor, the variable capacitance subsystem to have a second capacitance value ($C_2$); detecting, by at least one processor, a second voltage ($V_{M2}$) across the variable capacitance subsystem when the conductive sensor is positioned adjacent the insulated conductor; and determining, by at least one processor, the AC voltage ($V_{AC}$) in the insulated conductor based at least in part on the detected first voltage ($V_{M1}$) and the detected second voltage ($V_{M2}$).

Determining the AC voltage ($V_{AC}$) in the insulated conductor may include determining the AC voltage ($V_{AC}$) in the insulated conductor according to the formula: $V_{AC}=V_{M1} \times [(C_1/C_2)-1]/[(C_1 V_{M1}/C_2 V_{M2})-1]$. Detecting each of the first voltage ($V_{M1}$) and the second voltage ($V_{M2}$) may include detecting each of the first voltage ($V_{M1}$) and the second voltage ($V_{M2}$) via at least one analog-to-digital converter (ADC) coupled to the variable capacitance subsystem. Detecting each of the first voltage ($V_{M1}$) and the second voltage ($V_{M2}$) may include detecting each of the first voltage ($V_{M1}$) and the second voltage ($V_{M2}$) at an effective resolution of at least 20 bits. Causing the variable capacitance subsystem to have a second capacitance value ($C_2$) may include causing the variable capacitance subsystem to have a second capacitance value which is one of at least twice the first capacitance value ($C_1$) or equal to or less than half of the first capacitance value ($C_1$). The method may further include: presenting, by the at least one processor, the determined AC voltage ($V_{AC}$) via a user interface. The method may further include: causing, by at least one processor, the variable capacitance subsystem to have a third capacitance value ($C_3$); detecting, by at least one processor, a third voltage ($V_{M3}$) across the variable capacitance subsystem when the conductive sensor is positioned adjacent the insulated conductor; and determining, by at least one processor, the AC voltage ($V_{AC}$) in the insulated conductor based at least in part on the detected first voltage ($V_{M1}$), second voltage ($V_{M2}$), and third voltage ($V_{M3}$). Determining the AC voltage ($V_{AC}$) of the insulated conductor may include determining the AC voltage ($V_{AC}$) in the insulated conductor according to the formula: $V_{AC}=C_3 V_{M3} \times [(V_{M2}-V_{M1})/(C_1 V_{M1}-C_2 V_{M2})]-V_{M3}$.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure are directed to systems and methods for measuring alternating current (AC) voltage of an insulated conductor (e.g., insulated wire) without requiring a galvanic connection between the conductor and a test electrode or probe. Generally, a non-galvanic contact (or "non-contact") voltage measurement system is provided which includes a variable capacitance subsystem that operates to generate a variable capacitive voltage between an insulated conductor under test and earth ground. During measurement, the non-contact voltage measurement system varies the capacitance of the variable capacitance subsystem to change the impedance of a capacitive divider circuit between the insulated conductor under test and earth ground. By sequentially making two (or three) measurements across the variable capacitance subsystem, the AC voltage of the insulated conductor can be determined without requiring any galvanic connection to the insulated conductor. Such systems which do not require a galvanic connection are referred to herein as "non-contact." As used therein, "electrically coupled" includes both direct and indirect electrical coupling unless stated otherwise.

Figure 1:
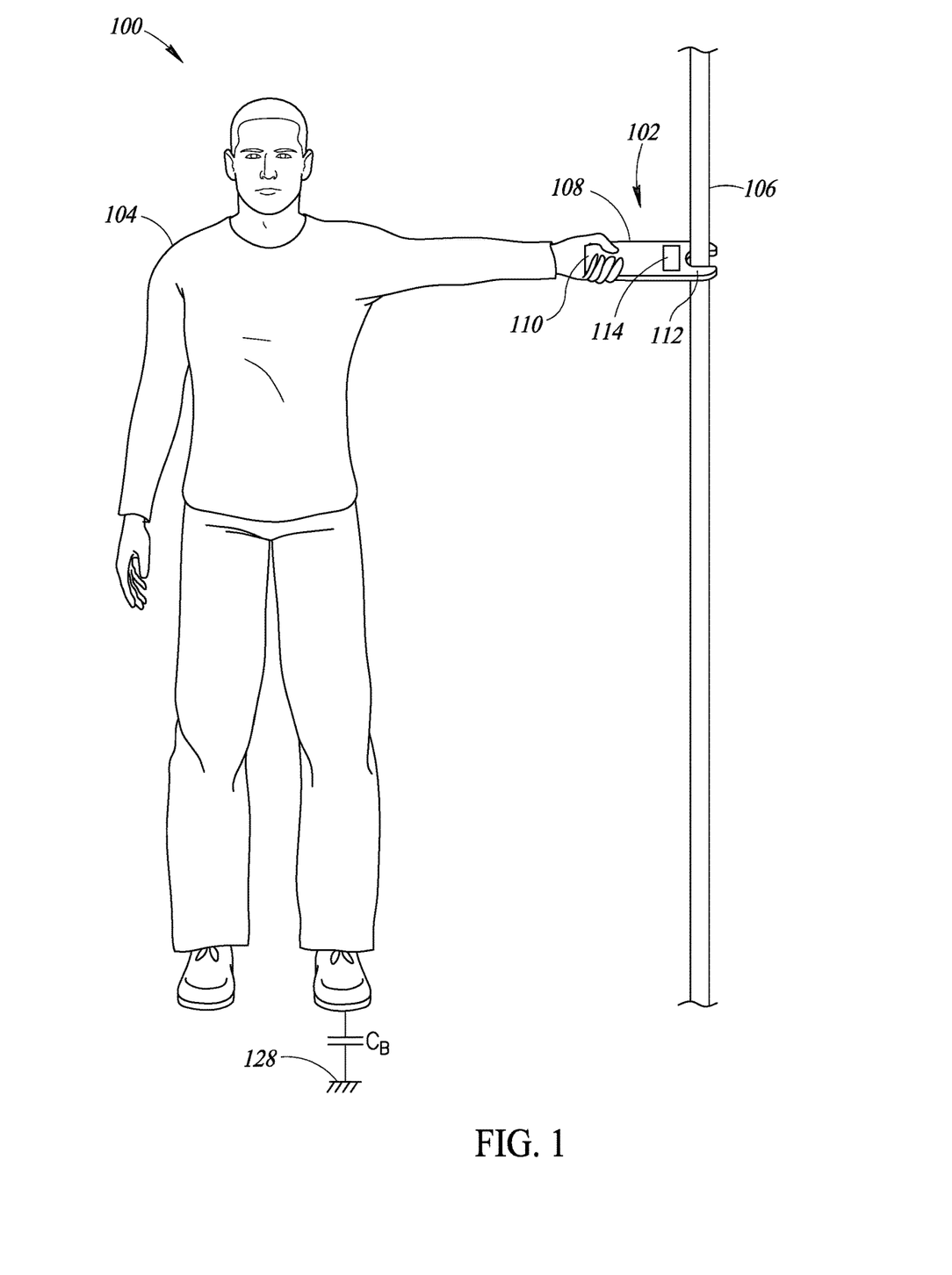
FIG. 1 is a pictorial diagram of an environment in which a non-contact voltage measurement system may be used by an operator to measure AC voltage present in an insulated wire without requiring galvanic contact with the wire, according to one illustrated implementation.
Figure 2:
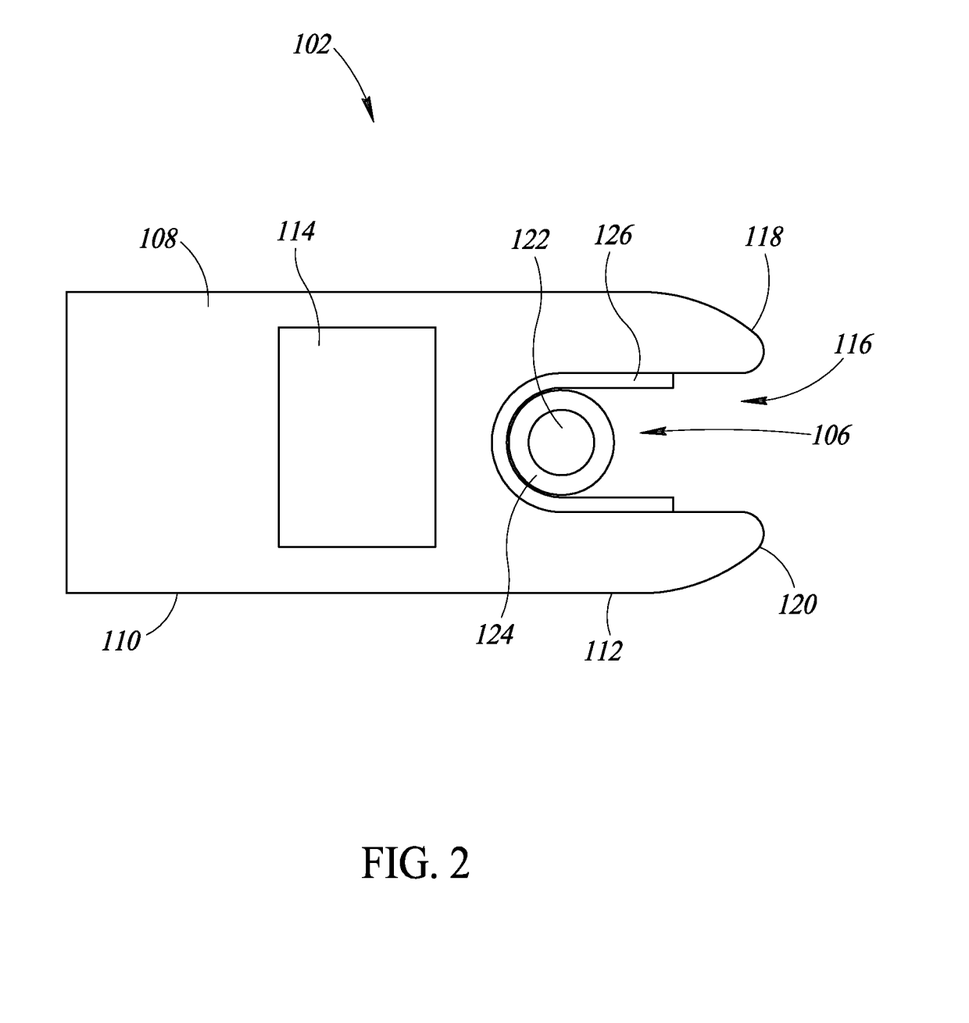
FIG. 2 is a top plan view of the non-contact voltage measurement system of FIG. 1, according to one illustrated implementation.

FIG. 1 is a schematic diagram of an environment 100 in which a non-contact voltage measurement system 102 of the present disclosure may be used by an operator 104 to measure AC voltage present in an insulated wire 106 without requiring galvanic contact between the non-contact voltage measurement system and the wire 106. FIG. 2 is a top plan view of the non-contact voltage measurement system 102 of FIG. 1. The non-contact voltage measurement system 102 includes a housing or body 108 which includes a grip portion or end 110 and a probe portion or end 112 opposite the grip portion. The housing 108 may also include a user interface 114 which facilitates user interaction with the non-contact voltage measurement system 102. The user interface 114 may include any number of inputs (e.g., buttons, dials, switches, touch sensor) and any number of outputs (e.g., display, LEDs, speakers, buzzers).

In at least some implementations, as shown best in FIG. 2, the probe portion or end 112 may include a recessed portion 116 defined by first and second extended portions 118 and 120. The recessed portion 116 receives the insulated wire 106. The insulated wire 106 includes a conductor 122 and an insulator 124 surrounding the conductor 122. The recessed portion 116 may include a sensor or electrode 126 which rests adjacent or substantially adjacent the insulator 124 of the insulated wire 106 when the insulated wire is positioned within the recessed portion 116 of the non-contact voltage measurement system 102.

As shown in FIG. 1, in use the operator 104 may grasp the grip portion 110 of the housing 108 and place the probe portion 112 proximate the insulated wire 106 so that the non-contact voltage measurement system 102 may accurately measure the AC voltage present in the wire with respect to earth ground (or another reference node). Although the probe portion or end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement system 102 to be positioned adjacent the insulated wire 106.

As discussed further below, in at least some implementations, the non-contact voltage measurement system 102 may utilize the body capacitance ($C_B$) between the operator 104 and ground 128 during the AC voltage measurement. The particular systems and methods used by the non-contact voltage measurement system 102 to measure AC voltage are discussed below with reference to FIGS. 3-7.

Figure 3:
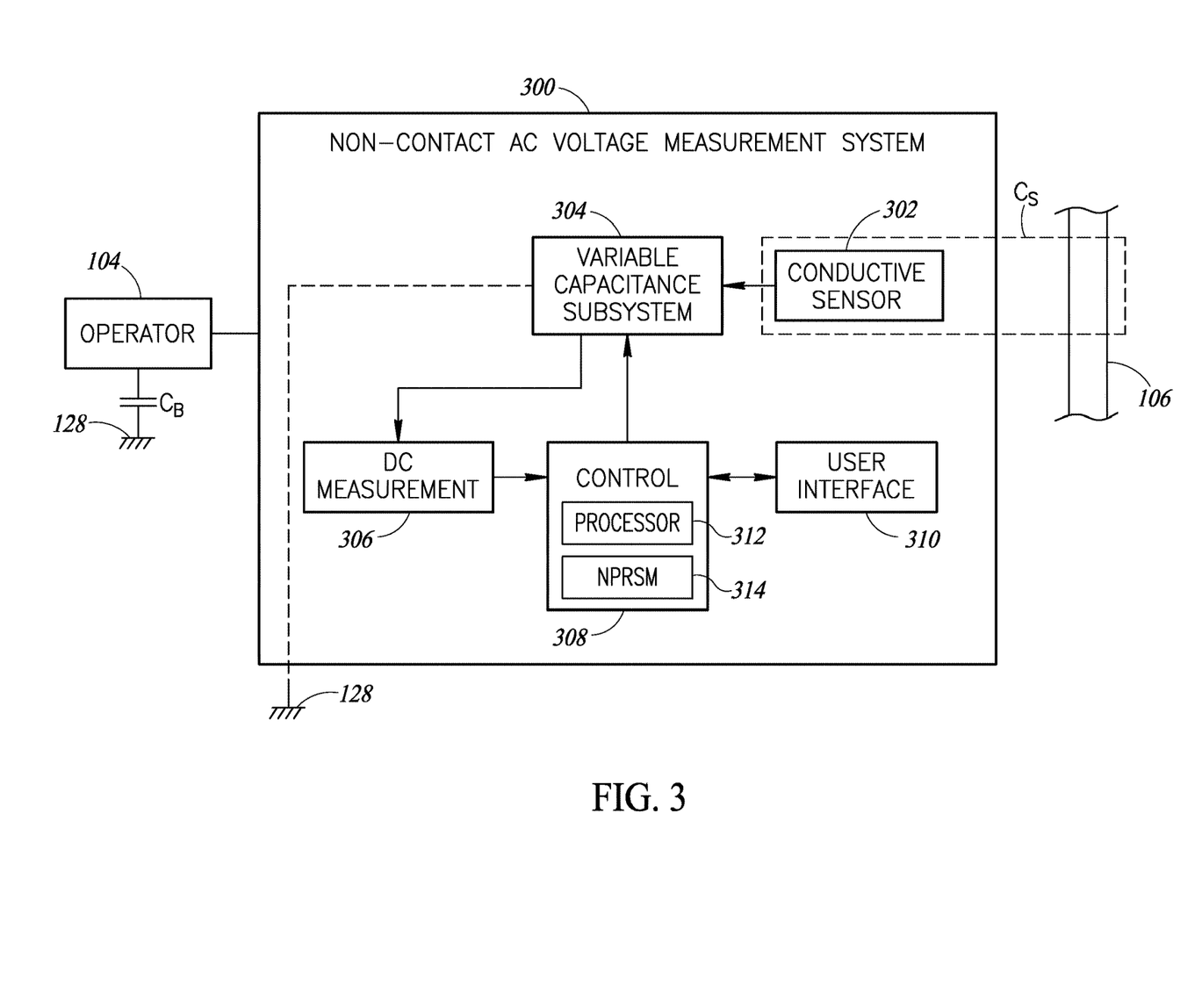
FIG. 3 is a high level block diagram of a non-contact voltage measurement system, according to one illustrated implementation.

FIG. 3 is a high level block diagram of a non-contact voltage measurement system 300. The non-contact voltage measurement system 300 may be similar or identical to the non-contact voltage measurement system 102 of FIGS. 1 and 2 discussed above.

The non-contact voltage measurement system 300 includes a conductive sensor or electrode 302 which is sized, dimensioned and positioned to be adjacent the insulated wire 106 when the operator 104 positions the probe portion or end 112 (FIG. 1) proximate the wire. The sensor 302 may be similar or identical to the sensor 126 of FIG. 2, for example. When the non-contact voltage measurement system 300 is positioned proximate the insulated wire 106 with the sensor 302 adjacent the wire, the sensor capacitively couples with the insulated wire. In other words, a conductive portion of the sensor 302 comprises one half of a sensor capacitor ($C_S$), with the conductor 122 of the insulated wire 106 (FIG. 2) comprising the other half of the sensor capacitor. In at least some implementations, the sensor 302 may be designed such that the sensitivity to electromagnetic fields on a side of the sensor facing the insulated wire 106 is greater than the sensitivity to electromagnetic fields on other sides of the sensor not facing the insulated wire.

The non-contact voltage measurement system 300 also includes a variable capacitance subsystem 304 which is electrically coupled to the conductive sensor 302. The variable capacitance subsystem 304 has a capacitance value which is selectively variable between at least a first capacitance value ($C_1$) and a second capacitance value ($C_2$), where the second capacitance value ($C_2$) different from the first capacitance value ($C_1$). In at least some implementations, the variable capacitance subsystem 304 may be controlled to selectively have a capacitance value which is variable between at least a first capacitance value ($C_1$), a second capacitance value ($C_2$), and a third capacitance value ($C_3$), where each of the first, second and third capacitance values are different from one another. As discussed further below, the variable capacitance subsystem 304 is used to vary the capacitance of a series capacitive circuit which extends from the insulated wire 106 through the non-contact voltage measurement system 300 to earth ground 128 or other reference node.

In at least some implementations, at least one of the capacitance values (e.g., capacitance value $C_1$) may be selectively variable to accommodate varying values of input signals and input capacitances. For example, the system 300 may determine that the input signal is too large or too small for an accurate measurement, and may selectively adjust one or more of the capacitance values so that accurate signal measurements may be obtained. As such, one or more of the capacitance values (e.g., $C_1$) may implemented utilizing a plurality of physical capacitors which may be selectively combined to provide a desired capacitance value suitable for a particular input signal and input capacitance.

The non-contact voltage measurement system 300 also includes a voltage measurement subsystem 306 which is operative to sense the voltage, or a signal indicative of the voltage, across the variable capacitance subsystem 304. In at least some implementations, the voltage measurement subsystem 306 may include an analog-to-digital converter (ADC) which converts an analog voltage signal into a digital signal. For example, the voltage measurement subsystem 306 may include an ADC which has a relatively high effective resolution, such as 20 or more bits (e.g., 22 bits) of resolution, which facilitates highly accurate measurements. In at least some implementations, the voltage measurement subsystem 306 may include conditioning circuitry (e.g., one or more amplifiers and/or filters) to buffer, shape, and/or amplify the detected voltage from the variable capacitance subsystem 304 prior to converting the signal to digital form using an ADC.

The non-contact voltage measurement system 300 may also include a controller 308 which is communicatively coupled to the voltage measurement subsystem 306 and the variable capacitance subsystem 304. The controller 308 may be any suitable hardware, software or combination thereof. As an example, the controller 308 may include one or more processors 312 and one or more nontransitory processor-readable storage media (NPRSM) 314 communicatively coupled to the one or more processors. The nontransitory processor-readable storage media 314 may store instructions and/or data which, when executed by the one or more processors 312, cause the one or more processors to implement the functionality discussed herein (e.g., measure AC voltage in the insulated wire 106).

The controller 308 may include any type of processing unit, such as one or more central processing units (CPUs), digital signal processors (DSPs), application-specific integrated circuits (ASICs), field programmable gate arrays (FPGAs), programmable logic controllers (PLCs), artificial neural network circuits or systems, or any other logic components. The nontransitory processor-readable storage medium coupled to the controller 308 may include any type of nontransitory volatile and/or non-volatile memory.

The non-contact voltage measurement system 300 may also include a user interface 310 communicatively coupled to the controller 308. The user interface 310 may include any number of inputs (e.g., buttons, dials, switches, touch sensor) and any number of outputs (e.g., display, LEDs, speakers, buzzers). In at least some implementations, the controller 308 and/or user interface 310 may include one or more wired and/or wireless communication interfaces (e.g., USB, Bluetooth®, WiFi®) which allow data and/or instructions to be communicated between the non-contact voltage measurement system 300 and one or more external devices.

In operation, the operator 104 may position the non-contact voltage measurement system 300 proximate the insulated wire 106 so that the sensor 302 capacitively couples with the wire to form the sensor capacitor $C_S$. When the sensor 302 is so positioned, the controller 308 may cause the variable capacitance subsystem 304 to have different capacitance values, and may obtain measurements from the voltage measurement subsystem 306 at each of the different capacitance values. The controller 308 may then determine the magnitude of the AC voltage present in the insulated wire 106 based on the obtained measurements, and present the result to the operator 104 via the user interface 310. Additional details regarding the particular implementations of the non-contact voltage measurement system 300 are discussed below with reference to FIGS. 4-6.

Figure 4:
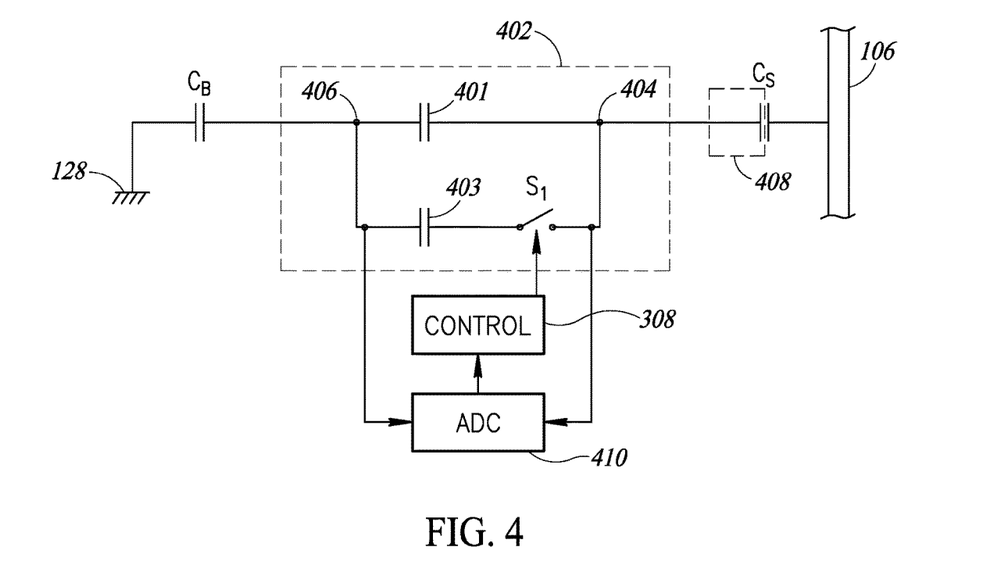
FIG. 4 is a schematic diagram of a non-contact voltage measurement system which includes a variable capacitance subsystem that utilizes two capacitors, according to one illustrated implementation.

FIG. 4 is a schematic diagram of a non-contact voltage measurement system 400 which includes a variable capacitance subsystem 402 that utilizes two capacitors, designated capacitors 401 and 403. The capacitors 401 and 403 may have capacitance values which are the same as each other or different from each other. As a non-limiting example, the capacitors 401 and 403 may each have a capacitance value of 1000 picofarads (pF). As another example, the capacitor 401 may have a capacitance value of 1000 pF and the capacitor 403 may have a capacitance value of 2000 pF.

The variable capacitance subsystem 402 includes a first capacitance subsystem node 404 and a second capacitance subsystem node 406. The capacitor 401 is electrically coupled between the first capacitance subsystem node 404 and the second capacitance subsystem node 406. The first capacitance subsystem node 404 is further electrically coupled to a conductive sensor 408, which may be similar or identical to the conductive sensors 126 and 302 of the non-contact voltage measurement systems 102 and 300, respectively, of FIGS. 2 and 3 discussed above. As discussed above, when the non-contact voltage measurement system 400 is positioned adjacent the insulated wire 106, the conductive sensor 408 forms one half of a sensor capacitor $C_S$, with the conductor 122 (FIG. 2) of the wire 106 forming the other half of the sensor capacitor $C_S$.

The variable capacitance subsystem 402 also includes a switch $S_1$ which operates to selectively electrically couple the capacitor 403 in parallel with the capacitor 401. Thus, by selectively controlling the switch $S_1$, the capacitance value between the first capacitance subsystem node 404 and the second capacitance subsystem node 406 is selectively variable between the capacitance value of the capacitor 401 and the sum of the capacitance values of the capacitors 401 and 403. In the case where the capacitors 401 and 403 have the same capacitance values (e.g., 1000 pF), the capacitance of the variable capacitance subsystem 402 when the switch $S_1$ is closed is twice the capacitance of the variable capacitance subsystem 402 when the switch $S_1$ is opened (e.g., 2000 pF versus 1000 pF).

The second capacitance subsystem node 406 may be electrically coupled to ground 128 via body capacitance $C_B$, which is the capacitance of the operator 104 (FIGS. 1 and 2) holding the non-contact voltage measurement system 400 during operation. Generally, the operator's body may be modeled as a conductor covered by a thin insulator with respect to ground 128. Typically, the body capacitance $C_B$ is in the range of tens to low hundreds of picofarads (e.g., 50-300 pF), depending on various factors. In at least some implementations, rather than utilizing the body capacitance $C_B$, the second capacitance subsystem node 406 may be optionally electrically coupled to ground 128 via a suitable electrical connection between the non-contact voltage measurement system 400 and ground.

The controller 308 is coupled to selectively control the operation of the switch $S_1$, which in turn selectively controls the capacitance value of the variable capacitance subsystem 402 to be either capacitance value $C_1$ or capacitance value $C_2$. In this example, the capacitance value $C_1$ is equal to the capacitance of the capacitor 401, and the capacitance value $C_2$ is equal to the sum of the capacitances of the capacitors 401 and 403. In other examples, depending on the arrangement of capacitors and one or more switches between the first capacitance subsystem node 404 and the second capacitance subsystem node 406, different capacitance values $C_1$ and $C_2$ in the variable capacitance subsystem 402 may be selectively attained.

The non-contact voltage measurement system 400 also includes an ADC 410 which is electrically coupled to the first capacitance subsystem node 404 and the second capacitance subsystem node 406. The ADC 410 is communicatively coupled to the controller 308 via a suitable interface (e.g., synchronous serial interface (SSI)). The ADC 410 is operative to convert an analog voltage between the first capacitance subsystem node 404 and the second capacitance subsystem node 406 into a digital signal, and to provide the digital signal to the controller 308. In at least some implementations, the ADC 410 may have a relatively high effective resolution, such as 20 or more bits (e.g., 22 bits, 24 bits, 30 bits) of resolution. Although not shown for clarity, the ADC 410 may include or be coupled to conditioning circuitry (e.g., one or more amplifiers and/or filters) to buffer, shape, and/or amplify the detected voltage from the variable capacitance subsystem 402 prior to converting the signal to digital form. Further, although the controller 308 and ADC 410 are shown schematically as separate components, in at least some implementations some or all of the functionality may be combined into a single system or component (e.g., a single integrated circuit).

To measure the AC voltage in the wire 106 when the sensor 408 is positioned adjacent the wire such that the sensor and the wire form the sensor capacitor $C_S$, the controller 308 may first cause the variable capacitance subsystem 402 to have the first capacitance value $C_1$ between the first capacitance subsystem node 404 and the second capacitance subsystem node 406. For example, the controller 308 may achieve such by opening the switch $S_1$, which causes the variable capacitance subsystem 402 to have a capacitance value equal to the capacitance of the capacitor 401.

Next, while the variable capacitance subsystem 402 has the first capacitance value $C_1$, the controller 308 may cause the ADC 410 to capture or measure a first voltage $V_{M1}$ between the first capacitance subsystem node 404 and the second capacitance subsystem node 406. Such voltage $V_{M1}$ may be stored by the controller 308 in a nontransitory processor-readable storage medium for subsequent use.

Next, after obtaining the measurement of the first voltage $V_{M1}$, the controller 308 may cause the variable capacitance subsystem 402 to have the second capacitance value $C_2$ between the first capacitance subsystem node 404 and the second capacitance subsystem node 406. For example, the controller 308 may achieve such by closing the switch $S_2$ to place the capacitor 403 in parallel with the capacitor 401, which causes the variable capacitance subsystem 402 to have a capacitance value equal to the sum of the capacitance values of the capacitors 401 and 403.

While the variable capacitance subsystem 402 has the second capacitance value $C_2$, the controller 308 may cause the ADC 410 to capture or measure a second voltage $V_{M2}$ between the first capacitance subsystem node 404 and the second capacitance subsystem node 406.

Next, the controller 308 may determine the AC voltage in the insulated wire 106 based at least in part on the detected first voltage $V_{M1}$, the detected second voltage $V_{M2}$, the first capacitance value $C_1$ and the second capacitance value $C_2$. An example process for determining the AC voltage in the insulated wire 106 is discussed below with reference to FIG. 5.

Figure 5:
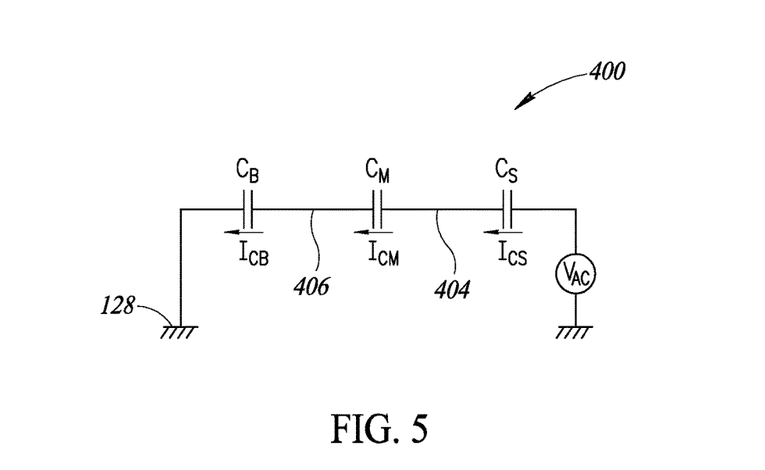
FIG. 5 is a schematic circuit diagram of the non-contact voltage measurement system of FIG. 4, according to one illustrated implementation.

FIG. 5 shows a schematic circuit diagram of the non-contact voltage measurement system 400 of FIG. 4. In this example, the AC voltage of the insulated wire 106 is represented by an AC source ($V_{AC}$). A series capacitive circuit is formed between the AC source ($V_{AC}$), the sensor capacitor $C_S$, a measurement capacitance $C_M$ which is either the capacitance value $C_1$ or the capacitance value $C_2$ depending on the state of the switch $S_1$, and the body capacitance $C_B$ of the operator 104 (FIGS. 1 and 2). As discussed above, the ADC 410 obtains a first voltage measurement $V_{M1}$ across the nodes 404 and 406 when the variable capacitance subsystem 402 has a first capacitance value (i.e., $C_M = C_1$), and obtains a second voltage measurement $V_{M2}$ across the nodes 404 and 406 when the variable capacitance subsystem has a second capacitance value (i.e., $C_M = C_2$). The measured voltage $V_M$ is equal to the potential difference between the voltage ($V_{404}$) at the node 404 and the voltage ($V_{406}$) at the node 406 (i.e., $V_M = V_{404} - V_{406}$).

The current at node 404 may be expressed by the equation:

$$I_{CS} - I_{CM} = 0 \quad (1)$$

The current ($I_{CS}$) is given by the following equation:

$$I_{CS} = \frac{V_{AC} - V_{404}}{\frac{1}{s \times C_S}} \quad (2)$$

where ($V_{AC} - V_{404}$) is the voltage across the sensor capacitor $C_S$, s is the Laplace variable, and ($1/(s \times C_S)$) is the impedance of the sensor capacitor $C_S$. The current ($I_{CM}$) is given by the following equation:

$$I_{CM} = \frac{V_{404} - V_{406}}{\frac{1}{s \times C_M}} \quad (3)$$

where ($V_{404}-V_{406}$) is the voltage across the capacitor $C_M$ and ($1/(s \times C_M)$) is the impedance of the capacitance $C_M$.

Similarly, the current at the node 406 may be expressed by the equation:

$$I_{CM} - I_{CB} = 0 \quad (4)$$

The current ($I_{CB}$) is given by the following equation:

$$I_{CB} = \frac{V_{406} - 0}{\frac{1}{s \times C_B}} \quad (5)$$

where ($V_{406}-0$) is the voltage across the body capacitor $C_B$ and ($1/(s \times C_B)$) is the impedance of the body capacitance $C_B$. The current ($I_{CM}$) is provided above.

Using equations (1) and (4) above, and $V_M = V_{404} - V_{406}$, $V_M$ may be expressed by the following equation:

$$V_M = V_{AC} \times \frac{C_x}{C_M + C_x} \quad (6)$$

where $$C_x = \frac{C_B \times C_S}{C_B + C_S} \quad (7)$$

As discussed above, the ADC 410 obtains a first voltage measurement $V_{M1}$ when the variable capacitance system 402 has the capacitance value $C_1$, and obtains a second voltage measurement $V_{M2}$ when the variable capacitance system 402 has the capacitance value $C_2$. Thus, $V_{M1}$ and $V_{M2}$ may be expressed by the following equations:

$$V_{M1} = V_{AC} \times \frac{C_x}{C_1 + C_x} \quad (8)$$

$$V_{M2} = V_{AC} \times \frac{C_x}{C_2 + C_x}$$

Equations (8) and (9) may be solved for the AC voltage ($V_{AC}$) in the insulated wire 106, which is provided by the following equation:

$$V_{AC} = \frac{V_{M1}\left(\frac{C_1}{C_2} - 1\right)}{\frac{C_1 V_{M1}}{C_2 V_{M2}} - 1} \quad (10)$$

As can be seen from equation (10), the AC voltage ($V_{AC}$) can be determined during runtime using only the known capacitance values $C_1$ and $C_2$ (or the ratio between the capacitance values $C_1$ and $C_2$) and the measured voltages $V_{M1}$ and $V_{M2}$. That is, the sensor capacitor $C_S$ and the body capacitance $C_B$ need not be determined to obtain the AC voltage ($V_{AC}$) in the insulated wire 106. It is further noted that the frequency of the AC voltage drops out of the equations, but the overall impedance of the system 400 depends on the frequency and the capacitance of the smallest capacitor in the circuit. For example, with a sensor capacitance $C_S$ of 1 pF which is the smallest capacitor in the circuit, the impedance of the circuit is on the order of 3.5 GΩ at 50 Hz.

Figure 6:
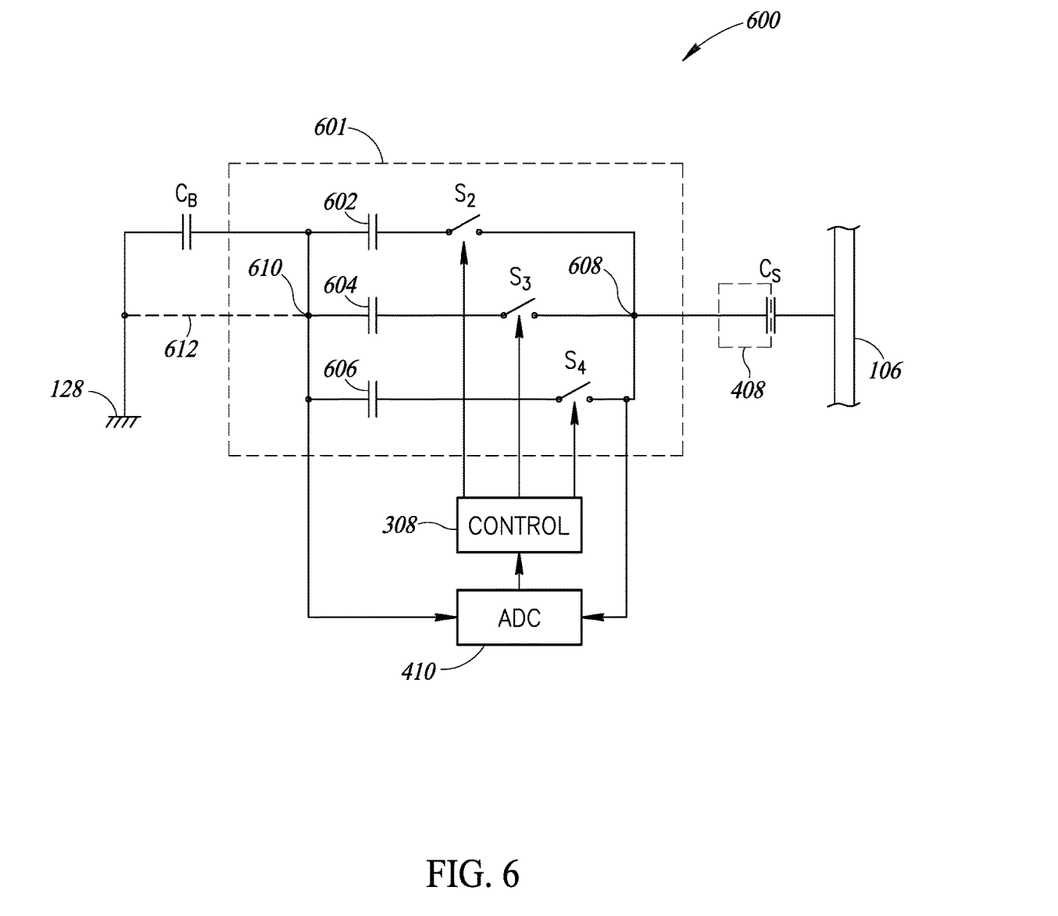
FIG. 6 is a schematic diagram of a non-contact voltage measurement system which includes a variable capacitance subsystem that utilizes three capacitors, according to one illustrated implementation.

FIG. 6 is a schematic diagram of a non-contact voltage measurement system 600 which includes a variable capacitance subsystem 601 that utilizes three capacitors, namely capacitors 602, 604, and 606. The non-contact voltage measurement system 600 is similar or identical to the non-contact voltage measurement systems discussed above, so only substantial differences are discussed below for the sake of brevity.

The non-contact voltage measurement system 600 includes a first capacitance subsystem node 608 electrically coupled to the sensor 408, and a second capacitance subsystem node 610 electrically coupled to ground 128 via the body capacitance $C_B$ of the operator 104 (FIGS. 1 and 2). In at least some implementations, the second capacitive subsystem node 610 may be optionally electrically coupled directly to ground 128 via a suitable electrical connection 612 ("reference connection").

The capacitor 602 may be selectively coupled in series between the nodes 608 and 610 via a switch $S_2$ which is controllable by the controller 308. The capacitor 604 may be selectively coupled in series between the nodes 608 and 610 via a switch $S_3$ which is controllable by the controller 308. The capacitor 606 may be selectively coupled in series between the nodes 608 and 610 via a switch $S_4$ which is controllable by the controller 308. In at least some implementations, the controller 308 closes one of the switches $S_2$, $S_3$ and $S_4$ at a time to couple one of the capacitors in series between the nodes 608 and 610 at a time. In such instances, each of the capacitors 602, 604 and 606 may have different capacitance values from each other. For example, the capacitor 602 may have a capacitance value of 1000 pF, the capacitor 604 may have a capacitance value of 2000 pF and the capacitor 606 may have a capacitance value of 4000 pF. Generally, the capacitance values should be chosen to provide a relatively large variation in the voltage measurements when each of the capacitors is switched into the circuit.

To measure the AC voltage ($V_{AC}$) in the wire 106 when the sensor 408 is positioned adjacent the wire 106 such that the sensor and the wire form the sensor capacitor $C_S$, the controller 308 may first cause the variable capacitance subsystem 402 to have the first capacitance value $C_1$ between the first capacitance subsystem node 608 and the second capacitance subsystem node 610. For example, the controller 308 may achieve such by closing the switch $S_2$ and opening the switches $S_3$ and $S_4$, which causes the variable capacitance subsystem 601 to have a capacitance value equal to the capacitance of the capacitor 602.

Next, while the variable capacitance subsystem 402 has the first capacitance value $C_1$, the controller 308 may cause the ADC 410 to capture a first measured voltage $V_{M1}$ between the first capacitance subsystem node 608 and the second capacitance subsystem node 610. Such voltage $V_{M1}$ may be stored by the controller 308 in a nontransitory processor-readable storage medium for subsequent use.

Next, after obtaining the measurement of the first voltage $V_{M1}$, the controller 308 may cause the variable capacitance subsystem 601 to have the second capacitance value $C_2$ between the first capacitance subsystem node 608 and the second capacitance subsystem node 610. For example, the controller 308 may achieve such by closing the switch $S_3$ and opening the switches $S_2$ and $S_4$, which causes the variable capacitance subsystem 601 to have a capacitance value equal to the capacitance value of the capacitor 604.

While the variable capacitance subsystem 601 has the second capacitance value $C_2$, the controller 308 may cause the ADC 410 to capture a second measured voltage $V_{M2}$ between the first capacitance subsystem node 608 and the second capacitance subsystem node 610.

After obtaining the measurement of the second voltage $V_{M2}$, the controller 308 may cause the variable capacitance subsystem 601 to have the third capacitance value $C_3$ between the first capacitance subsystem node 608 and the second capacitance subsystem node 610. For example, the controller 308 may achieve such by closing the switch $S_4$ and opening the switches $S_2$ and $S_3$, which causes the variable capacitance subsystem 601 to have a capacitance value equal to the capacitance value of the capacitor 606.

While the variable capacitance subsystem 601 has the third capacitance value $C_3$, the controller 308 may cause the ADC 410 to capture a third measured voltage $V_{M3}$ between the first capacitance subsystem node 608 and the second capacitance subsystem node 610.

Next, the controller 308 may determine the AC voltage ($V_{AC}$) in the insulated wire 106 based at least in part on the detected first voltage $V_{M1}$, the detected second voltage $V_{M2}$, the detected third voltage $V_{M3}$, the first capacitance value $C_1$, the second capacitance value $C_2$ and the third capacitance value $C_3$. An example process for determining the AC voltage ($V_{AC}$) in the insulated wire 106 is discussed below.

When the switch $S_2$ is closed and the switches $S_3$ and $S_4$ are opened, the AC voltage ($V_{AC}$) in the insulated wire 106 may be expressed by the following equation:

$$V_{AC} = I_1(Z_S + Z_B + Z_{602}) \quad (11)$$

where $I_1$ is the series current, $Z_S$ is the unknown impedance of the sensor capacitor $C_S$, $Z_B$ is the unknown impedance of the body capacitance $C_B$ of the operator 104 (FIGS. 1 and 2), and $Z_{602}$ is the impedance of the capacitor 602.

When the switch $S_3$ is closed and the switches $S_2$ and $S_4$ are opened, the AC voltage in the insulated wire 106 may be expressed by the following equation:

$$V_{AC} = I_2(Z_S + Z_B + Z_{604}) \quad (12)$$

where $I_2$ is the series current, $Z_S$ is the unknown impedance of the sensor capacitor $C_S$, $Z_B$ is the unknown impedance of the body capacitance $C_B$ of the operator 104 (FIGS. 1 and 2), and $Z_{604}$ is the impedance of the capacitor 604.

When the switch $S_4$ is closed and the switches $S_2$ and $S_3$ are opened, the AC voltage ($V_{AC}$) in the insulated wire 106 may be expressed by the following equation:

$$V_{AC} = I_3(Z_S + Z_B + Z_{606}) \quad (13)$$

where $I_3$ is the series current, $Z_S$ is the unknown impedance of the sensor capacitor $C_S$, $Z_B$ is the unknown impedance of the body capacitance $C_B$ of the operator 104 (FIGS. 1 and 2), and $Z_{606}$ is the impedance of the capacitor 606.

Setting equations (11) and (12) equal to each other and solving for $Z_S + Z_B$ gives the following equation:

$$Z_S + Z_B = \frac{V_{M2} - V_{M1}}{I_1 - I_2} \quad (14)$$

Substituting equation (14) into equation (13) gives the following equation:

$$V_{AC} = I_3 \times \left( \frac{V_{M2} - V_{M1}}{I_1 - I_2} + Z_{606} \right) \quad (15)$$

Substituting $I_X = V_X/Z_X$ and $Z_X = 1/(2\pi\omega C_X)$ and simplifying the result, the AC voltage ($V_{AC}$) in the insulated wire 106 may be expressed by the following equation:

$$V_{AC} = C_{606} V_{606} \left( \frac{V_{M2} - V_{M1}}{C_{602} V_{602} - C_{604} V_{604}} \right) + V_{M3} \quad (16)$$

The determined AC voltage of the insulated wire 106 may then be presented to the operator or communicated to an external device via a suitable communications interface.

Figure 7:
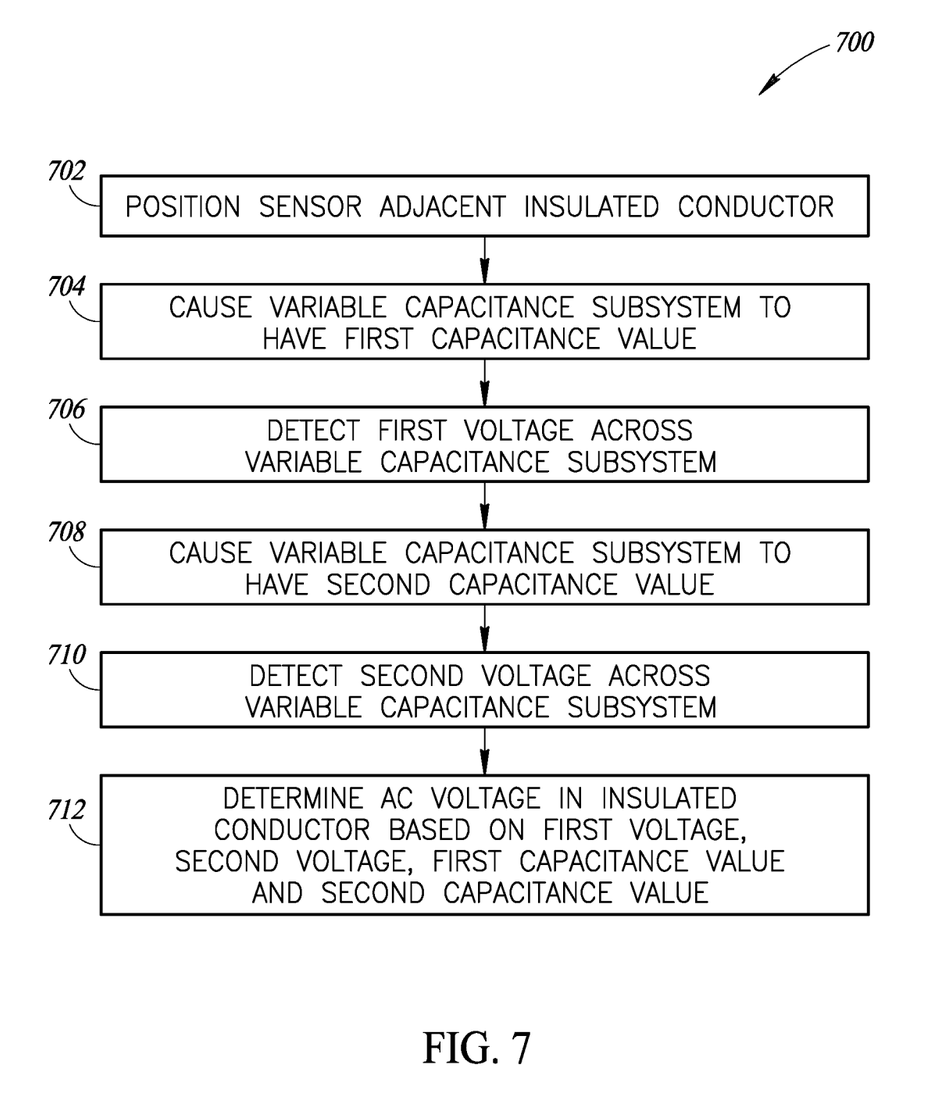
FIG. 7 is a flow diagram of a method of operating a non-contact voltage measurement system to measure AC voltage in an insulated wire without galvanic contact with the wire, according to one illustrated implementation.

FIG. 7 is a flow diagram of a method 700 of operating a non-contact voltage measurement system to measure AC voltage in an insulated wire without galvanic contact. The non-contact voltage measurement system may be similar or identical to any of the implementations of non-contact voltage measurement systems discussed above, and/or may include various combinations of such non-contact voltage measurement systems.

The method 700 may begin at 702 when an operator positions a conductive sensor of the non-contact voltage measurement system adjacent the insulated wire to be measured. As discussed above, when the conductive sensor is positioned adjacent the insulated wire, the sensor and conductor in the insulated wire are capacitively coupled together to form a sensor capacitor $C_S$.

At 704, at least one processor (controller) of the non-contact voltage measurement system may cause a variable capacitance subsystem electrically coupled to the sensor to have a first capacitance value. In at least some implementations, the variable capacitance subsystem includes at least a first capacitor, a second capacitor, and a processor-controlled switch, for example.

At 706, the at least one processor may detect or measure a first voltage across the variable capacitance subsystem and store the first measured voltage in a nontransitory processor-readable storage medium. As discussed above, in at least some implementations, the at least one processor may detect or measure the voltage across the variable capacitance subsystem via an ADC which has a relatively high effective resolution (e.g., 20 bits, 22 bits).

At 708, the at least one processor of the non-contact voltage measurement system may cause the variable capacitance subsystem to have a second capacitance value which is different from the first capacitance value. In at least some implementations, one of the first capacitance value and the second capacitance value may be at least twice the other of the first capacitance value and the second capacitance value. As a non-limiting example, each of the first and second capacitance values may be between 1000 pF and 5000 pF.

At 710, the at least one processor may detect or measure a second voltage across the variable capacitance subsystem and store the second measured voltage in a nontransitory processor-readable storage medium.

At 712, the at least one processor may determine the AC voltage in the insulated conductor based at least in part on the first and second measured voltages and the first and second capacitance values. For example, as discussed above, the at least one processor may determine the AC voltage ($V_{AC}$) in the insulated conductor according to the equation:

$$V_{AC} = V_{M1} \times [(C_1/C_2) - 1]/[(C_1 V_{M1}/C_2 V_{M2}) - 1] \quad (17)$$

where $C_1$ and $C_2$ are the first and second capacitance values, respectively, and $V_{M1}$ and $V_{M2}$ are the first and second measured voltages across the variable capacitance subsystem.

After determining the AC voltage in the insulated conductor, the at least one processor may present the result to the operator via a user interface communicatively coupled to the at least one processor. The user interface may include visual components (e.g., display, a light emitter (e.g., LED), a plurality of light emitters (e.g., LEDs)) and/or audio components (e.g., speaker, buzzer). Additionally or alternatively, the at least one processor may communicate the results to an external device via a suitable wired and/or wireless communications interface.

In at least some implementations, after obtaining the second measured voltage, the at least one processor may cause the variable capacitance subsystem to have the third capacitance value. In such instances, the at least one processor may then detect or measure a third measurement voltage across the variable capacitance subsystem.

Then, the at least one processor may determine the AC voltage ($V_{AC}$) in the insulated conductor based at least in part on the first measured voltage ($V_{M1}$), second measured voltage ($V_{M2}$), third measured voltage ($V_{M3}$), first capacitance value ($C_1$), second capacitance value ($C_2$) and third capacitance value ($C_3$). For example, the at least one processor may determine the AC voltage ($V_{AC}$) in the insulated conductor according to the equation:

$$V_{AC} = C_3 V_{M3} \times [(V_{M2} - V_{M1})/(C_1 V_{M1} - C_2 V_{M2})] + V_{M3} \quad (18)$$

The determined AC voltage ($V_{AC}$) may then be presented to the operator via a suitable interface and/or communicated to an external device via a wired and/or wireless communications interface.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. For example, four or more capacitors may be included in the variable capacitance subsystem, with appropriate mathematical adjustments in the formula for determining $V_{AC}$ to take into account additional capacitance and voltage measurements.

As another example, in at least some implementations a non-contact voltage measurement system may not utilize a processor to execute instructions. For example, a non-contact voltage measurement system may be hardwired to provide some or all of the functionality discussed herein. Additionally, in at least some implementations a non-contact voltage measurement system may not utilize a processor to cause or initiate the different measurements discussed herein. For example, such non-contact voltage measurement system may rely on one or more separate inputs, such as a user-actuated button which causes the different capacitances to appear in the variable capacitance subsystem and subsequent measurements to occur.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system to measure alternating current (AC) voltage in an insulated conductor, the system comprising:
    a conductive sensor positionable adjacent the insulated conductor without galvanically contacting the conductor, wherein the conductive sensor capacitively couples with the insulated conductor;
    a variable capacitance subsystem which includes a first capacitance subsystem node and a second capacitance subsystem node, the first capacitance subsystem node electrically coupled to the conductive sensor, and the first capacitance subsystem node and the second capacitance subsystem node having a capacitance therebetween which is selectively variable between at least a first capacitance value ($C_1$) and a second capacitance value ($C_2$), the second capacitance value ($C_2$) being different from the first capacitance value ($C_1$);
    a voltage measurement subsystem which in operation detects a voltage between the first capacitance subsystem node and the second capacitance subsystem node;
    at least one nontransitory processor-readable storage medium that stores at least one of processor-executable instructions or data; and
    at least one processor communicatively coupled to the at least one nontransitory processor-readable storage medium, and in operation, in response to execution of the processor-executable instructions or data, the at least one processor:
        causes the variable capacitance subsystem to have the first capacitance value ($C_1$) between the first capacitance subsystem node and the second capacitance subsystem node;
        causes the voltage measurement subsystem to detect a first voltage ($V_{M1}$) between the first capacitance subsystem node and the second capacitance subsystem node;

causes the variable capacitance subsystem to have the second capacitance value ($C_2$) between the first capacitance subsystem node and the second capacitance subsystem node;

causes the voltage measurement subsystem to detect a second voltage ($V_{M2}$) between the first capacitance subsystem node and the second capacitance subsystem node; and determines the AC voltage ($V_{AC}$) in the insulated conductor based at least in part on the detected first voltage ($V_{M1}$) and the detected second voltage ($V_{M2}$).

2. The system of claim 1 wherein the at least one processor:

determines the AC voltage ($V_{AC}$) in the insulated conductor according to the formula: $V_{AC}=V_{M1}\times[(C_1/C_2)-1]/[(C_1V_{M1}/C_2V_{M2})-1]$.

3. The system of claim 1 wherein the voltage measurement subsystem comprises at least one analog-to-digital converter (ADC).

4. The system of claim 1 wherein the measurement subsystem has an effective resolution of at least 20 bits.

5. The system of claim 1 wherein the variable capacitance subsystem comprises at least a first capacitor and a second capacitor which are each selectively electrically coupled between the first capacitance subsystem node and the second capacitance subsystem node.

6. The system of claim 1 wherein the variable capacitance subsystem comprises a first capacitor electrically coupled between the first capacitance subsystem node and the second capacitance subsystem node, and a second capacitor which is selectively electrically coupled between the first capacitance subsystem node and the second capacitance subsystem node.

7. The system of claim 1 wherein a ratio ($C_1$:$C_2$) of the first capacitance value ($C_1$) to the second capacitance value ($C_2$) is between 2:5 and 1:10 inclusive.

8. The system of claim 1 wherein the first capacitance value ($C_1$) is selectively variable to accommodate different values of input signals and input capacitance.

9. The system of claim 1, further comprising:
a user interface communicatively coupled to the at least one processor, wherein the at least one processor presents the determined AC voltage ($V_{AC}$) via the user interface.

10. The system of claim 9 wherein the user interface comprises at least one of a display or a plurality of light emitters.

11. The system of claim 1 wherein, in operation, the second capacitance subsystem node is electrically coupled to a reference node via the body of a user operating the system.

12. The system of claim 1, further comprising:
a reference connection which electrically couples the second capacitance subsystem node to earth ground.

13. The system of claim 1 wherein the first capacitance subsystem node and the second capacitance subsystem node have a capacitance therebetween which is further selectively variable between at least the first capacitance value ($C_1$), the second capacitance value ($C_2$) and a third capacitance value ($C_3$), and in response to execution of the processor-executable instructions or data in the nontransitory processor-readable storage medium, the at least one processor:

causes the variable capacitance subsystem to have the third capacitance value ($C_3$) between the first capacitance subsystem node and the second capacitance subsystem node;

causes the voltage measurement subsystem to detect a third voltage ($V_{M3}$) between the first capacitance subsystem node and the second capacitance subsystem node; and determines the AC voltage ($V_{AC}$) in the insulated conductor based at least in part on the detected first voltage ($V_{M1}$), second voltage ($V_{M2}$), and third voltage ($V_{M3}$).

14. The system of claim 13 wherein the at least one processor:

determines the AC voltage ($V_{AC}$) in the insulated conductor according to the formula: $V_{AC}=C_3V_{M3}\times[(V_{M2}-V_{M1})/(C_1V_{M1}-C_2V_{M2})]+V_{M3}$.

15. A system to measure alternating current (AC) voltage in an insulated conductor, the system comprising:

a conductive sensor positionable adjacent an insulated conductor without galvanically contacting the conductor, wherein the conductive sensor capacitively couples with the insulated conductor;

a variable capacitance subsystem electrically coupled to the conductive sensor;

a voltage measurement subsystem which in operation detects a voltage across the variable capacitance subsystem;

at least one nontransitory processor-readable storage medium that stores at least one of processor-executable instructions or data; and at least one processor communicatively coupled to the at least one nontransitory processor-readable storage medium, and in operation, in response to execution of the processor-executable instructions or data, the at least one processor:

causes the variable capacitance subsystem to have a first capacitance value ($C_1$);

detects, via the voltage measurement subsystem, a first voltage ($V_{M1}$) across the variable capacitance subsystem when the conductive sensor is positioned adjacent the insulated conductor;

causes the variable capacitance subsystem to have a second capacitance value ($C_2$);

detects, via the voltage measurement subsystem, a second voltage ($V_{M2}$) across the variable capacitance subsystem when the conductive sensor is positioned adjacent the insulated conductor; and determines the AC voltage ($V_{AC}$) in the insulated conductor based at least in part on the detected first voltage ($V_{M1}$) and the detected second voltage ($V_{M2}$).

16. The system of claim 15 wherein the at least one processor:

determines the AC voltage ($V_{AC}$) in the insulated conductor according to the formula: $V_{AC}=V_{M1}\times[(C_1/C_2)-1]/[(C_1V_{M1}/C_2V_{M2})-1]$.

17. The system of claim 15 wherein the voltage measurement subsystem has an effective resolution of at least 20 bits.

18. The system of claim 15 wherein the variable capacitance subsystem comprises at least a first capacitor, a second capacitor, and a switch coupled to at least one of the first capacitor and the second capacitor, wherein the switch is selectively operable by the at least one processor to cause the variable capacitance subsystem to have the first capacitance value ($C_1$) and the second capacitance value ($C_2$).

19. A method of operating a system to measure alternating current (AC) voltage in an insulated conductor, the system comprising a conductive sensor positionable adjacent an insulated conductor without galvanically contacting the conductor, and a variable capacitance subsystem electrically coupled to the conductive sensor; the method comprising:

causing, by at least one processor, the variable capacitance subsystem to have a first capacitance value ($C_1$);

detecting, by at least one processor, a first voltage ($V_{M1}$) across the variable capacitance subsystem when the conductive sensor is positioned adjacent the insulated conductor;

causing, by at least one processor, the variable capacitance subsystem to have a second capacitance value ($C_2$);

detecting, by at least one processor, a second voltage ($V_{M2}$) across the variable capacitance subsystem when the conductive sensor is positioned adjacent the insulated conductor; and determining, by at least one processor, the AC voltage ($V_{AC}$) in the insulated conductor based at least in part on the detected first voltage ($V_{M1}$) and the detected second voltage ($V_{M2}$).

20. The method of claim 19 wherein determining the AC voltage ($V_{AC}$) in the insulated conductor comprises determining the AC voltage ($V_{AC}$) in the insulated conductor according to the formula: $V_{AC}=V_{M1}\times[(C_1/C_2)-1]/[(C_1V_{M1}/C_2V_{M2})-1]$.

21. The method of claim 19 wherein detecting each of the first voltage ($V_{M1}$) and the second voltage ($V_{M2}$) comprises detecting each of the first voltage ($V_{M1}$) and the second voltage ($V_{M2}$) via at least one analog-to-digital converter (ADC) coupled to the variable capacitance subsystem.

22. The method of claim 19 wherein detecting each of the first voltage ($V_{M1}$) and the second voltage ($V_{M2}$) comprises detecting each of the first voltage ($V_{M1}$) and the second voltage ($V_{M2}$) at an effective resolution of at least 20 bits.

23. The method of claim 19 wherein causing the variable capacitance subsystem to have a second capacitance value ($C_2$) comprises causing the variable capacitance subsystem to have a second capacitance value, wherein a ratio ($C_1:C_2$) of the first capacitance value (C1) to the second capacitance value (C2) is between 2:5 and 1:10 inclusive.

24. The method of claim 19, further comprising:
presenting, by the at least one processor, the determined AC voltage ($V_{AC}$) via a user interface.

25. The method of claim 19, further comprising:
causing, by at least one processor, the variable capacitance subsystem to have a third capacitance value ($C_3$);

detecting, by at least one processor, a third voltage ($V_{M3}$) across the variable capacitance subsystem when the conductive sensor is positioned adjacent the insulated conductor; and determining, by at least one processor, the AC voltage ($V_{AC}$) in the insulated conductor based at least in part on the detected first voltage ($V_{M1}$), second voltage ($V_{M2}$), and third voltage ($V_{M3}$).

26. The method of claim 25 wherein determining the AC voltage ($V_{AC}$) of the insulated conductor comprises determining the AC voltage ($V_{AC}$) in the insulated conductor according to the formula: $V_{AC}=C_3V_{M3}\times[(V_{M2}-V_{M1})/(C_1V_{M1}-C_2V_{M2})]-V_{M3}$.

* * * * *

UNITED STATES PATENT AND TRADEMARK OFFICE
CERTIFICATE OF CORRECTION

Page 1 of 1

PATENT NO. : 10,119,998 B2
APPLICATION NO. : 15/345256
DATED : November 6, 2018
INVENTOR(S) : Paul Andrew Ringsrud et al.

It is certified that error appears in the above-identified patent and that said Letters Patent is hereby corrected as shown below:

In the Claims

Column 20, Claim 26, Line 26-27:
"formula: $V_{AC} = C_3 V_{M3} \times [V_{M2} - V_{M1}/C_1 V_{M2}] - V_{M3}$"
Should read:
--formula: $V_{AC} = C_3 V_{M3} \times [V_{M2} - V_{M1}/C_1 V_{M2}] + V_{M3}$--.

Signed and Sealed this
Twenty-ninth Day of October, 2019

Andrei Iancu
*Director of the United States Patent and Trademark Office*